(12) United States Patent
Kang

(10) Patent No.: US 6,826,108 B2
(45) Date of Patent: Nov. 30, 2004

(54) INTEGRATED CIRCUIT MEMORY DEVICE POWER SUPPLY CIRCUITS AND METHODS OF OPERATING SAME

(75) Inventor: Kyung-Woo Kang, Kyounggi-do (KR)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 10/279,896

(22) Filed: Oct. 24, 2002

(65) Prior Publication Data

US 2004/0001385 A1 Jan. 1, 2004

(30) Foreign Application Priority Data

Jun. 26, 2002 (KR) ........................................ 2002-35883

(51) Int. Cl.[7] .............................................. G11C 7/00
(52) U.S. Cl. ................................................... 365/226
(58) Field of Search ................................ 365/226, 207, 365/189.09

(56) References Cited

U.S. PATENT DOCUMENTS

| | | | |
|---|---|---|---|
| 5,189,316 A | 2/1993 | Murakami et al. | 307/296.1 |
| 5,442,277 A | 8/1995 | Mori et al. | 323/312 |
| 5,483,486 A | 1/1996 | Javanifard et al. | 365/185.17 |
| 5,488,327 A | 1/1996 | Okada | 327/536 |
| 5,796,293 A | 8/1998 | Yoon et al. | 327/536 |
| 5,896,328 A * | 4/1999 | Tanizaki et al. | 365/200 |
| 5,942,784 A | 8/1999 | Harima et al. | 257/372 |
| 6,018,252 A | 1/2000 | Imaizumi | 326/81 |
| 6,087,891 A | 7/2000 | Yoon et al. | 327/530 |
| 6,266,284 B1 | 7/2001 | Kurihara et al. | 365/189.05 |
| 6,600,692 B2 * | 7/2003 | Tanzawa | 365/226 |

* cited by examiner

Primary Examiner—Thong Q. Le
(74) Attorney, Agent, or Firm—Myers Bigel Sibley & Sajovec

(57) ABSTRACT

Integrated circuit devices include a control circuit that selectively drive a power supply terminal of a memory cell array and a sense amplifier of the integrated circuit device with a first power supply voltage and/or a second power supply voltage responsive to a control signal. The second power supply voltage is delivered to the integrated circuit device separate from the first power supply voltage. The integrated circuit device may further include an internal voltage generator circuit powered by an external power supply separate from the second power supply voltage and the first power supply voltage may be an internal voltage generated by the internal voltage generator circuit. The integrated circuit device may also include a data output circuit that is powered by the second power supply voltage. Corresponding methods are also provided.

34 Claims, 6 Drawing Sheets

INTEGRATED CIRCUIT MEMORY DEVICE POWER SUPPLY CIRCUITS AND METHODS OF OPERATING SAME

RELATED APPLICATION

This application claims priority to Korean Patent Application No. 2002-35883, filed on Jun. 26, 2002, the disclosure of which is hereby incorporated herein by reference.

FIELD OF THE INVENTION

The present invention relates to semiconductor memory devices, and more particularly, to semiconductor memory devices having power circuits therein.

BACKGROUND OF THE INVENTION

Integrated circuit (semiconductor) devices continue to be developed so as to increase their capacity and speed and/or to lower their power consumption. The internal memory cell array power supply voltage is a voltage that is typically reduced from an external power supply voltage to lower device power consumption. When the internal memory cell array power supply voltage is reduced, the operational characteristics of the device, such as the performance of the bit-line sense amplifiers, may be degraded.

One approach to providing a reduced voltage internal power supply is to provide a down converter to drop the external power supply voltage from a relatively high level to a substantially constant level to generate an internal power supply voltage for the integrated circuit device, such as an integrated circuit memory device. For example, in an integrated circuit memory device such as a dynamic random access memory (DRAM) or the like, an internal voltage down converter is typically provided for converting an external power supply voltage to supply a substantially constant internal power supply voltage to internal circuits, such as memory cell arrays. An example of an memory device with a down converter that generates an internal supply voltage for sensing and amplifying the potential of a bit line connected to a memory cell is generally illustrated in FIG. 1. As shown in FIG. 1, the circuit includes a reference voltage generator 10 that generates a reference voltage VREFA and a cell array voltage generator 21. The cell array voltage generator 21 compares the reference voltage VREFA with a cell array internal voltage AIVC generated by the cell array voltage generator 21 based on the reference voltage VREFA. The cell array voltage generator 21 driver stage is typically constructed with a reference voltage comparator circuit provided by current mirror type differential amplifiers and with a driver circuit that may include P-type MOS transistors.

As further illustrated in FIG. 1, the memory device has a first power supply voltage VDD and first ground voltage VSS that are respectively provided to the reference voltage generator 10 and the cell array voltage generator 21 through a first power supply line 11 and a first ground line 12. In addition, a second power supply voltage VDDQ and second ground voltage VSSQ are respectively provided to the output buffers 80, 90 through a second power supply line 81 and a second ground line 82. As shown in FIG. 1, the reference voltage generator 10 and the cell array voltage generator 21 are provided as a peripheral circuit (relative to the memory cell arrays 60, 70) of the integrated circuit memory device.

Thus, the integrated circuit memory device illustrated in FIG. 1 includes separate external power supply voltage sources for driving the memory cell array and sense amplifier blocks 60, 70 and the output buffers 80, 90. Provision of such separate power supplies may improve an output driving function of the output data DOUT1, DOUT2 from the device and may further reduce or even eliminate interference between ones of the power supplies resulting from noise generated by the other power supply. As shown in FIG. 1, the first power supply voltage VDD is used to power the reference voltage generator 10 and the cell array voltage generator 21, which circuits generate the cell array internal voltage AIVC. The second power supply voltage VDDQ is applied as the external power supply voltage for the output buffers 80, 90. The voltage level of the second power supply voltage VDDQ may be the same or a different level than the first power supply voltage VDD.

The cell array internal voltage AIVC is supplied on line L1 to the memory cell array and sense amplifier blocks 60, 70 through the driving PMOS transistors 40, 50. Cell data output from the memory cell array and sense amplifier blocks 60, 70 is provided to the output buffers 80, 90 and is output as output data DOUT1, DOUT2. However, as the cell array internal voltage AIVC is generated based on the first power supply voltage VDD while the second power supply voltage VDDQ is used for the output buffers 80, 90, various problems may result. For example, as the amount of power consumed by the reference voltage generator 10 and the cell array voltage generator 21 may be relatively high, the power consumption of an overall chip may be undesirably increased. As the number of associated memory cell arrays and memory banks is increased, power consumption will also generally increase. In addition, bit line sensing speed may be limited as a result of the turn-on resistance characteristics of the P-type MOS transistors in the cell array voltage generator 21 that generates the voltage AIVC used in bit line sensing. When the bit line sensing speed slows, active restore operations may also deteriorate and various memory performance parameters, such as, RAS active command to CAS active command delay time (wherein "CAS active" refers to Read or Write command) for securing Bit Line Sensing time (tRCD), RAS Precharge time (i.e., the delay time between a RAS Precharge command and a next RAS active command) for securing Bit line equalize time (tRP) and RAS active time (i.e., the delay time from a RAS active command to a RAS Precharge command) for securing a Bit line sensing time and a cell restore time (tRAS), may be impacted or the operating margin for the memory device may become tighter.

Furthermore, as the first power supply voltage VDD is generally applied to the peripheral voltage generation circuit and, as the internal voltage AIVC to the core memory cell arrays, through a VDD pad, the cell array power supply and the peripheral circuit power supply are not isolated from each other. In other words, as no pad separation is provided between the cell array power supply and the peripheral circuit power supply, noise occurring in the cell array power supply may also affect the peripheral voltage generation circuit. If the peripheral circuit is affected by the noise, the reliability of the integrated circuit memory device may deteriorate.

More particularly, the first and second power supply lines 11, 81 and the first and second ground lines 12, 82 shown in FIG. 1 are typically formed from metal wires through a semiconductor fabricating process, and the metal wires are connected with the package exterior of the memory device on corresponding pins through corresponding pads. Therefore, the power supply noise may result from an inductance and a resistance component in the power supply line and the ground line. Such power supply noise can generally be divided into a power supply voltage noise and a ground noise, which are generally present during a restoring operation and/or a data output operation. For the restore operation, the power supply voltage noise may result from a voltage level increase towards the power supply voltage VDD in a bit line B/L, and the ground noise may result from discharge to the ground voltage VSS in an inverted bit line B/LB. In the case of the data output operation, the power supply noise may be caused by an external load circuit driven by the data output. Thus, the external resistance may cause a voltage drop that may reduce the voltage level applied not only to the peripheral circuits but also to the memory cell array and sense amplifier blocks 60, 70.

In addition, for the conventional integrated circuit memory device of FIG. 1, when a word line is driven or a sense amplifier is enabled, a relatively large current flow may momentarily occur, which may cause a drop in the level of the internal power supply voltage. In other words, such a current consumption in a final driver stage of the internal voltage down converter may adversely affect the mean operating current. Accordingly, the circuit of FIG. 1 may suffer from an undesirable level of power consumption and various other operational reliability problems.

SUMMARY OF THE INVENTION

Methods according to embodiments of the present invention provide for operation of integrated circuit devices. A power supply terminal of a memory cell array and a sense amplifier of the integrated circuit device are driven with a selected one of a first power supply voltage or a second power supply voltage responsive to a control signal. The second power supply voltage is delivered to the integrated circuit device separate from the first power supply voltage. More particularly, the power supply terminal may be a power supply terminal of a differential sense amplifier.

In some embodiments of the present invention, the first power supply voltage is an internal voltage generated by an internal voltage generator circuit of the integrated circuit device. The internal voltage generator circuit is powered by an external power supply voltage separate from the second power supply voltage. A power supply of a data output circuit of the integrated circuit may also be driven with the second power supply voltage. The level of the first power supply voltage may be at least equal to the level of the second power supply voltage. In various embodiments, the level of the first power supply voltage about equals the level of the second power supply voltage. The control signal may be an external control signal, such as a mode register set command.

In further embodiments of the present invention, integrated circuit devices are provided including a control circuit that drives a power supply terminal of a memory cell array and a sense amplifier of the integrated circuit device with a selected one of a first power supply voltage or a second power supply voltage responsive to a control signal. The second power supply voltage is delivered to the integrated circuit device separate from the first power supply voltage. The integrated circuit device may further include an internal voltage generator circuit powered by an external power supply voltage separate from the second power supply voltage, and the first power supply voltage may be an internal voltage generated by the internal voltage generator circuit. In addition, the integrated circuit device may include a data output circuit that is powered by the second power supply voltage.

In other embodiments of the present invention, the integrated circuit device includes a switch circuit that couples the second power supply voltage to the power supply terminal. The switch circuit may be a PMOS transistor and the control signal may be coupled to a gate of the PMOS transistor. The internal voltage generator circuit may also include a switch circuit that couples the internal voltage to the power supply terminal. In particular embodiments of the present invention, the internal voltage generator circuit includes a driver transistor that outputs the internal voltage and the switch circuit of the internal voltage generator includes a PMOS transistor that couples the first power supply voltage to a gate of the driver transistor.

In further embodiments of the present invention, integrated circuit memory devices are provided including a sense amplifier having first and second inputs electrically coupled to a pair of differential signal lines. A memory cell array is coupled to the sense amplifier. A voltage generator circuit is provided having an internal voltage output that is selectively coupled to one of the pair of differential signal lines. The voltage generator circuit is powered by a first power supply voltage. A second power supply voltage is selectively coupled to the one of the pair of differential signal lines. The second power supply voltage is delivered to the integrated circuit memory device separate from the external power supply voltage. A control circuit selects the internal voltage output or the second power supply voltage responsive to a control signal.

In other embodiments of the present invention, methods are provided for supplying power supply voltage in a semiconductor memory device. A second power supply voltage, applied from external to the semiconductor memory device separately from a first power supply voltage, is applied to a data output circuit. The second power supply voltage is directly supplied to a memory cell array and sense amplifier circuit as a cell array internal voltage for operation of the memory cell array and sense amplifier. The second power supply voltage maybe directly supplied to the memory cell array and sense amplifier circuit through a switch. The cell array internal voltage may be applied to a bit line connected to a memory cell through a sense amplifier.

In further embodiments of the present invention, circuits are provided for supplying cell array power supply voltage in a semiconductor memory device. A power supply providing line is provided, the power supply providing line configured to directly supply a second power supply voltage, applied from external to the semiconductor memory device separately from a first power supply voltage, to a memory cell array and sense amplifier circuit as a cell array internal voltage for operation of the memory cell array and sense amplifier. The first power supply voltage is for use in core and peripheral circuits of the semiconductor memory device and the second power supply voltage is for use in a data output circuit of the semiconductor memory device.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Signal lines and signals thereon may be referred to by the same reference names and characters.

Figure 1:
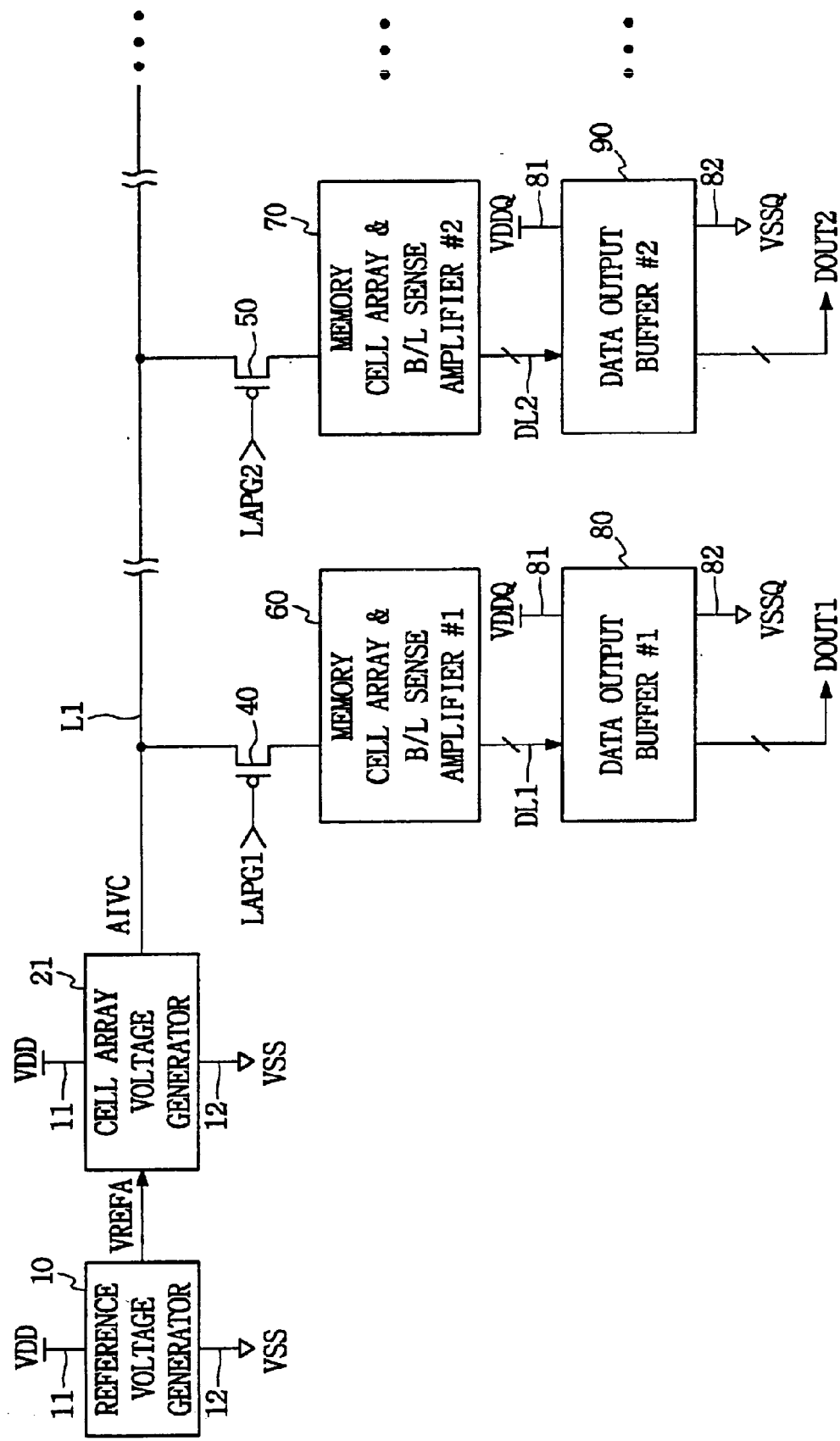
FIG. 1 is a schematic block diagram illustrating a power supply circuit in a conventional integrated circuit memory device such as a DRAM.
Figure 2:
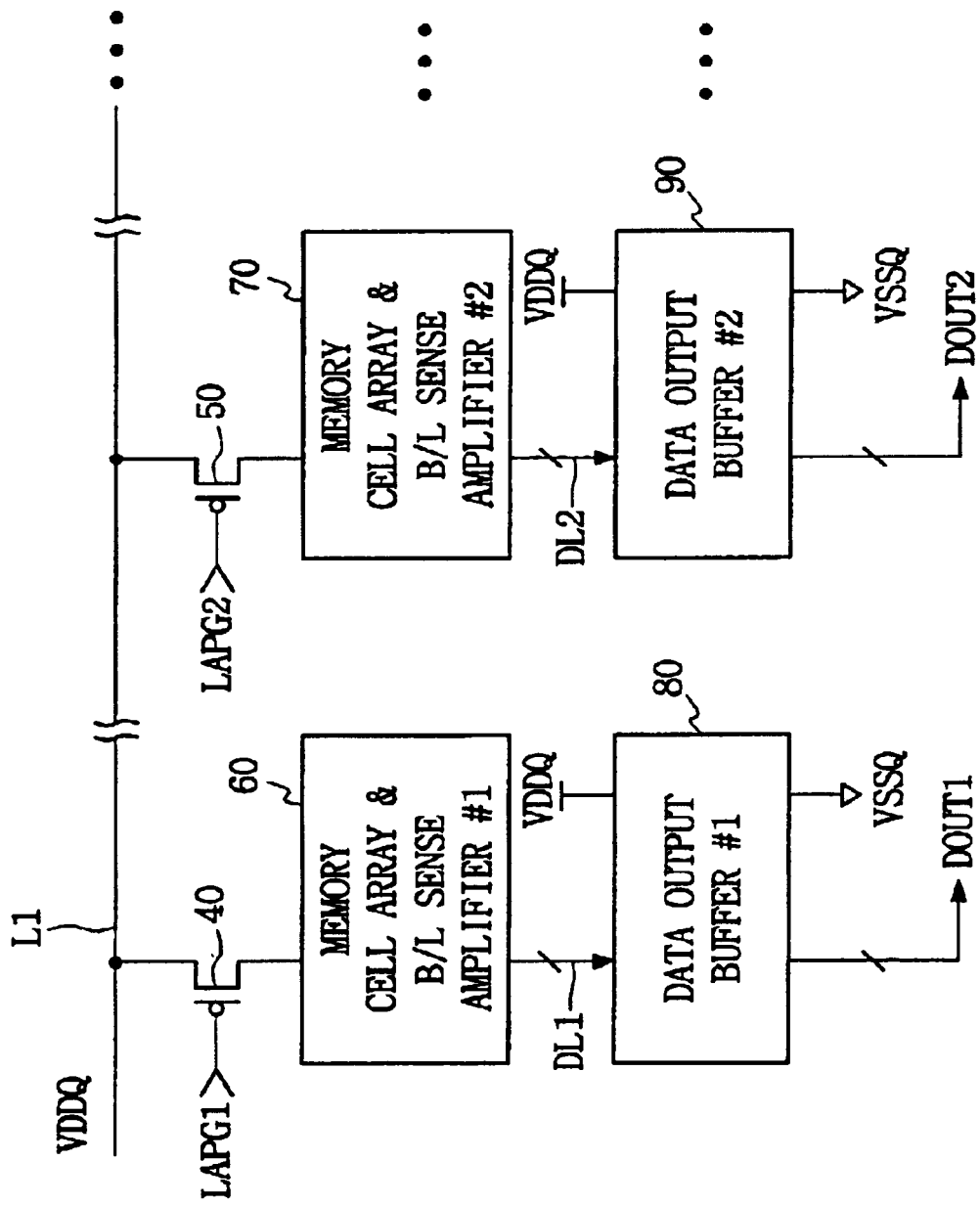
FIG. 2 is a schematic block diagram illustrating a power supply circuit according to some embodiments of the present invention.

FIG. 2 is a schematic block diagram illustrating a power supply circuit providing a power supply voltage of a semiconductor memory device in accordance with some embodiments of the present invention. The cell array internal voltage down converter including a reference voltage generator 10 and a cell array voltage generator 21 shown in FIG. 1 is not found in the circuit of FIG. 2. Thus, the second power supply voltage VDDQ is applied to the data output circuit, including output buffers 80, 90, and is also concurrently directly supplied as the cell array internal voltage AIVC used for operation of the memory cell array and sense amplifier blocks 60, 70. It is to be understood that the second power supply voltage VDDQ is externally applied to the semiconductor memory device separately from a first externally supplied power supply voltage VDD.

The voltage level of the second power supply voltage VDDQ as provided to the memory cell array and sense amplifier blocks 60, 70, through the cell array internal voltage supply line L1, may be set equal to the voltage level of the second power supply voltage VDDQ as applied to the output buffers 80, 90. The second power supply voltage VDDQ may be applied to a cell array internal voltage supplying line L1 from a first power supply voltage VDDQ pad while a different pad is provided for applying the second power supply voltage VDDQ to the output buffers 80, 90. Alternatively, the same pad may be used to provide the second power supply voltage VDDQ to both circuits. However, as a typical pin package for a semiconductor memory device includes more VDDQ pins than VDD pins, improved separation of power supply noise maybe attained if the output buffers 80, 90 and the cell array internal voltage supplying line L1 are provided the second power supply voltage VDDQ by two different pads.

For the embodiments illustrated in FIG. 2, a semiconductor memory device may be provided with reduced power consumption as a reference voltage generator and cell array voltage generator are not included. The risk that power supply noise in the cell array power supply may be transferred to a peripheral circuit power supply of the semiconductor memory device may also be reduced. Providing the cell array internal voltage supply line L1 in the semiconductor memory device without using a reference voltage generator and a cell array voltage generator to generate the cell array internal voltage may also simplify the circuit design and facilitate miniaturization and circuit integration.

Figure 3:
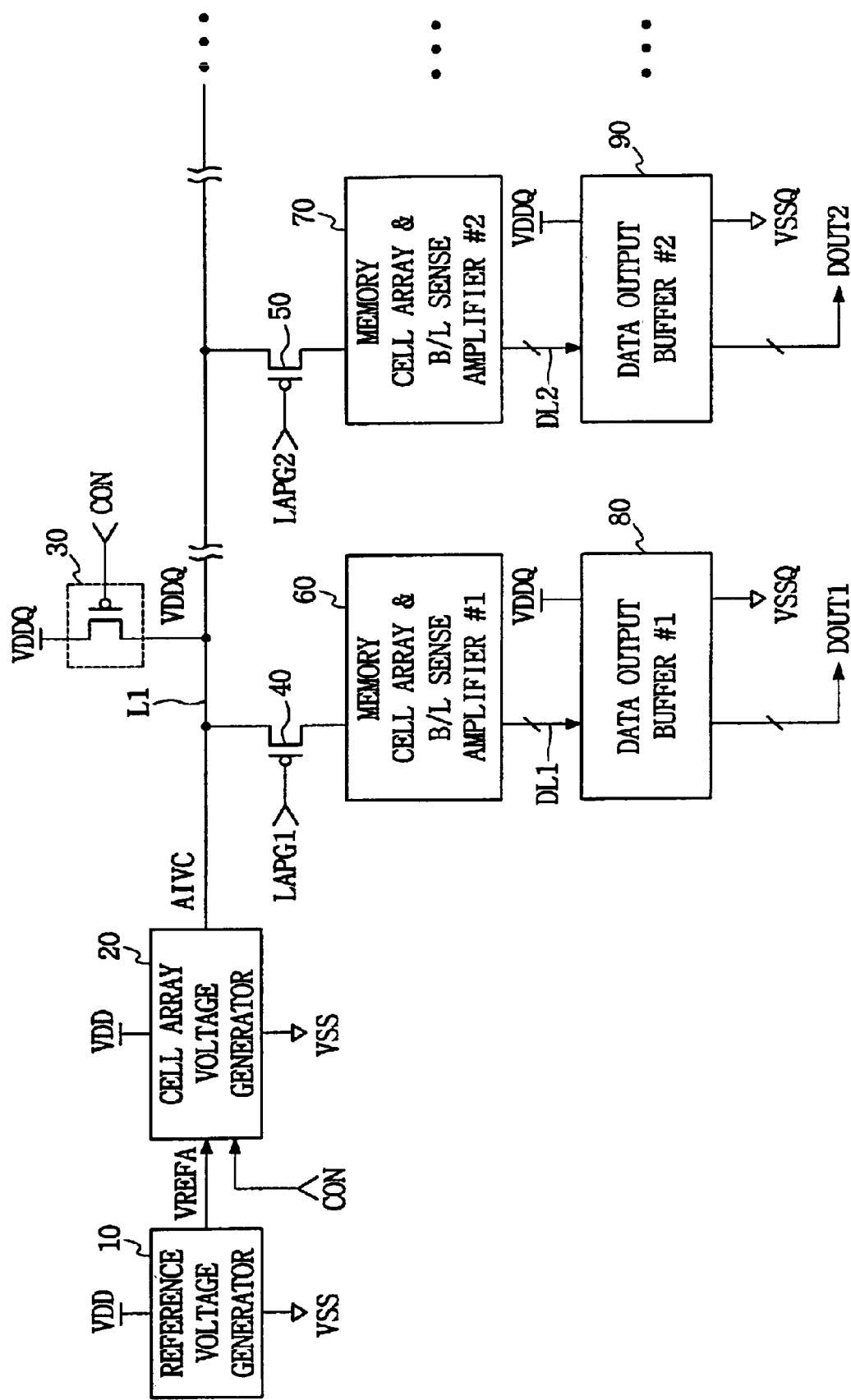
FIG. 3 is a schematic block diagram illustrating a power supply circuit according to further embodiments of the present invention.

FIG. 3 is a schematic block diagram illustrating a power supply circuit providing a power supply voltage of an integrated circuit memory device in accordance with further embodiments of the present invention. The cell array voltage supplying circuit of FIG. 3 is configured to supply the cell array internal voltage by selectively utilizing one of two or more sources of external power supply voltage. The cell array internal voltage generator circuit, including the reference voltage generator 10 and the cell array voltage generator 20, receives the first power supply voltage VDD that may be used in both core and peripheral circuits of the integrated circuit memory device. The cell array voltage internal generator circuit generates a cell array internal voltage AIVC for operation of the memory cell array and sense amplifier blocks 60, 70, and outputs the internal voltage AIVC to the cell array internal voltage supplying line L1. However, as an alternate power supply voltage may be utilized, the cell array internal voltage generator circuit of FIG. 3 may be selectively operated responsive to a control signal CON to provide, in combination with the switch 30, a control circuit for selecting one of a first power supply voltage or a second power supply voltage to drive the line L1.

The switch 30 providing a second power supply voltage supplying part is connected to the cell array internal voltage supplying line L1 to selectively couple a second power supply voltage to the line L1. As shown in the embodiments of FIG. 3, the switch 30 is a p-channel metal oxide semiconductor (PMOS) transistor that is activated in response to the operation control signal CON coupled to the gate of the PMOS transistor. When selected by the control signal CON, the second power supply voltage VDDQ is directly supplied as the cell array internal voltage AIVC through the switch 30. Thus, an alternate power supply voltage VDDQ, that may be applied from external to the integrated circuit device separately from the first power supply voltage VDD, may be applied to the memory cell array and sense amplifier blocks 60, 70. The second power supply voltage VDDQ is also illustrated in the embodiments of FIG. 3 as being applied to power the data output circuits 80, 90.

Accordingly, the cell array internal voltage for the embodiments illustrated in FIG. 3 may be beneficially supplied by selectively using one or more of a plurality of sources of external power supply voltage. An external control signal may be used for the selection. As a result, the power consumption and/or cross circuit power supply noise in the integrated circuit device may be reduced and the operational reliability of the device may be improved. In various embodiments of the present invention, the first power supply voltage VDD and the second power supply voltage VDDQ can be individually provided as 2.5V/2.5V, 2.5V/1.8V, 1.8V/1.8V. Thus, in such embodiments the voltage level of the first power supply voltage VDD may be at least equal to the voltage level of the second power supply voltage VDDQ. As such, the voltage level of the cell array internal voltage AIVC may be set equal to the voltage level of the second power supply voltage VDDQ.

For the particular components illustrated in FIG. 3, when the control signal CON is at a logic low level, the output of the cell array voltage generator 20 is switched off of the line L1 and the switch 30 is activated so that the second power supply voltage VDDQ is applied to the cell array internal voltage supplying line L1. The control signal CON can be provided from external to the integrated circuit memory device, for example, by using a mode register set command.

While FIG. 3 was described above with only one of the power supply selection circuits connecting a power supply voltage to the line L1 depending on the state of the control signal CON, the present invention is not so limited as selection of both the cell array voltage generator 20 and the switch 30 may be concurrent in other embodiments. In such alternate embodiments, the size of the PMOS transistor used as a driver transistor in the cell array voltage generator 20 may be smaller as current flow may also be provided through the switch 30.

Figure 4:
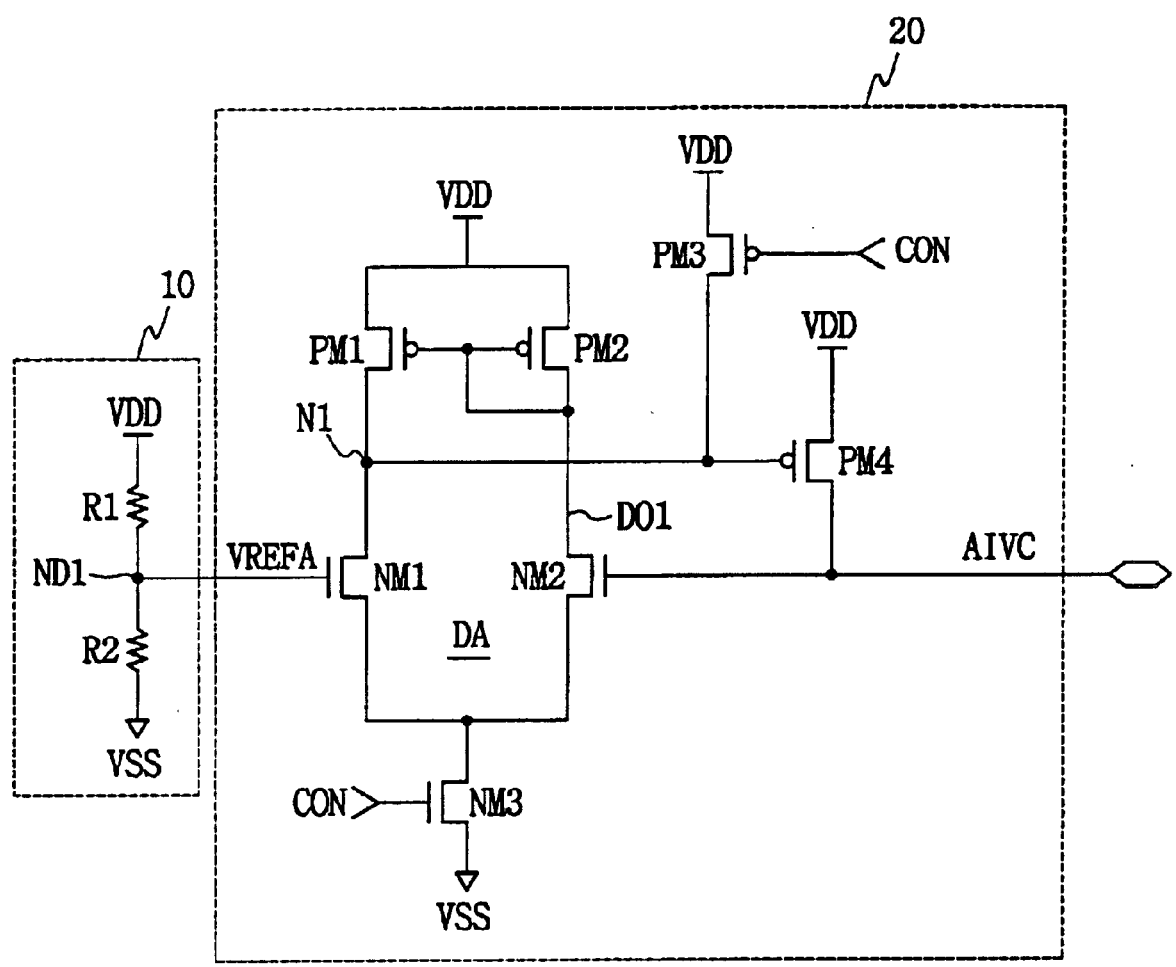
FIG. 4 is an electrical schematic illustrating embodiments of the power supply circuit of FIG. 3.

FIG. 4 is an electrical schematic illustrating embodiments of the power supply circuit of FIG. 3, more particularly, the reference voltage generator 10 and the cell array voltage generator 20. As shown in FIG. 4, a reference voltage VREFA is provided on a node ND1 having a voltage level based on a ratio of the resistance values of respective resistors R1, R2 as the output of the reference voltage generator 10. The voltage reference across the series resistors R1, R2 is provided by the first power supply voltage VDD and the first ground voltage VSS, respectively.

The cell array voltage generator 20 illustrated in FIG. 4 includes a current mirror type differential amplifier DA that amplifies the voltage level difference between the reference voltage VREFA and the cell array internal voltage AIVC, which is provided as the internal voltage output of the cell array voltage generator 20 and is fed back to the differential amplifier DA. The cell array voltage generator 20 further includes a driving transistor PM4 that couples the first power supply voltage VDD to the internal voltage output AIVC responsive to activation by the signal on node N1 of the differential amplifier DA to drive the cell array internal voltage AIVC. This differential amplifier DA illustrated in the embodiments of FIG. 4 includes PMOS transistors PM1, PM2, whose drains are coupled to first power supply voltage VDD and whose gates are coupled together. The n-channel metal oxide semiconductor (NMOS) transistors NM1, NM2 have drains that are respectively coupled to corresponding sources of the PMOS transistors PM1, PM2 and sources that are coupled to the drain of the NMOS transistor NM3. A current sink is defined by the NMOS transistor NM3, whose drain is connected to a common source of the N-type MOS transistors NM1, NM2 and whose source is connected to the first ground voltage VSS. The reference voltage VREFA is applied to the gate of the NMOS transistor NM1, and the cell array internal voltage AIVC is applied to the gate of the NMOS transistor NM2.

A switching select circuit is also illustrated in the embodiments of FIG. 4. In particular, a PMOS transistor PM3 whose gate is coupled to the control signal CON so as to be activated (turned on) when the control signal CON is low. As the drain of the PMOS transistor PM3 is coupled to the voltage VDD, when turned on, the voltage VDD is applied to the gate node of the driving transistor PM4. As a result, the driving transistor PM4 is turned off and the cell array internal voltage AIVC is not output (i.e., no current flow is provided).

When the control signal CON is high, the PMOS transistor PM3 is turned off and the NMOS transistor NM3 is turned on. As a result, when the voltage level of the cell array internal voltage AIVC is lower than the level of the reference voltage VREFA, the NMOS transistor NM1 is turned on by a higher voltage signal than the NMOS transistor NM2. Therefore, more current may flow through the node N1 than through the node DO1 and the voltage level of the node N1 becomes lower and the voltage level of the node DO1 starts to increase. This causes the voltage level applied to the gate of the PMOS transistor PM1 to increase. Thus, the voltage level of the node N1 gradually drops to a lower level, and thus, the driving PMOS transistor PM4, whose gate node is connected to the node N1, allows more current flow in its turn-on state. In other words, the voltage level of the cell array internal voltage AIVC may, thereby, be increased.

The voltage output is similarly regulated in the opposite case when the voltage level of the internal power supply voltage AIVC becomes higher than the reference voltage VREFA. In this case, the NMOS transistor NM2 is turned on with a greater input level to its gate than the NMOS transistor NM1. In turn, the voltage level of the node DO1 becomes lower and the amount of current supplied through the PMOS transistor PM1 is increased. As the voltage level of the node N1 is therefore increasing, the current amount flowing through the source-drain channel of the PMOS transistor PM4 is decreased so that the voltage level of the internal power supply voltage AIVC is reduced to track to the array reference voltage VREFA.

Figure 5:
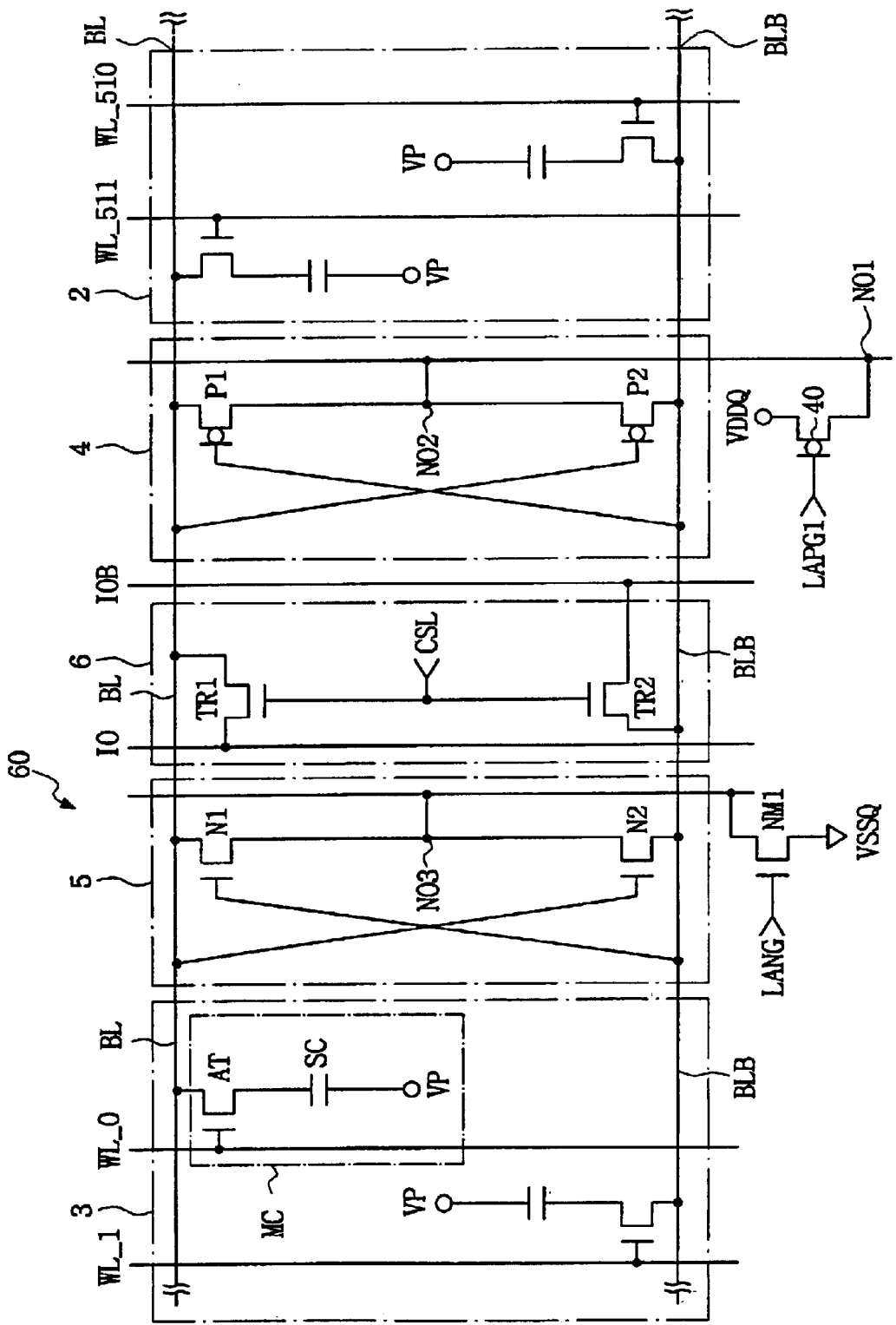
FIG. 5 is an electrical schematic illustrating application of power supply voltage to bits lines of a memory cell array according to embodiments of the present invention.

Referring now to the electrical schematic illustration of FIG. 5, application of the second power supply voltage VDDQ through a power supply terminal to a bit line of a differential sense amplifier according to some embodiments of the present invention will be further described. The embodiments of FIG. 5 illustrate a memory cell array and sense amplifier block 60 contained in a core region of an integrated circuit memory device, more particularly, a DRAM. The block 60, as illustrated in FIG. 5, includes an I/O gate part 6, a pull-down N-type sense amplifier 5 and a pull-up P-type sense amplifier 4 along with the memory cell arrays 2, 3. The memory cell arrays 2, 3 may include a plurality of memory cells MC, which are individually connected to a cross point of a word line WL and a bit line pair BL, BLB.

For a data access operation, when a P-type sense amplifier driving signal LAPG1 is applied at a logic low level to the gate of the PMOS transistor 40, the second power supply voltage VDDQ is provided to a node NO1 through the source-drain channel of the PMOS transistor 40. The second power supply voltage VDDQ applied to the node NO1 is, therefore applied to a node NO2 of the P-type sense amplifier 4. When a row address strobe RASB is enabled and a selected word line WLi is activated by an address decoder, the charge of addressed memory cells connected to the selected word line is transferred to a bit line pair. When a voltage potential difference is present on the bit line pair, one of the MOS transistors P1, P2 within the P-type sense amplifier may be turned on relatively strongly. Thus, the second power supply voltage VDDQ is applied to one bit line of the bit line pair BL, BLB for performance of a bit line sensing operation by the sense amplifier. As a result of the bit line sensing operation, complementary logic level data is presented on the data line pair IO, IOB, and the sensed data is applied to the data output buffer. Thus, in such an operation, the second power supply voltage VDDQ is applied as the operating power supply to access the memory cell MC. As shown in the embodiments of FIG. 5, a memory cell MC includes an access transistor AT and a storage capacitor SC defining the cell for a reading or writing operation of the memory cell array.

The pull-down N-type sense amplifier 5 shown in the embodiments of FIG. 5 performs the bit line sensing operation when the N-type sense amplifier driving signal is applied at a logic high level. However, further description of such operations are not provided herein to simplify the explanation of the present invention, as such operations are well know to those of skill in the art. Furthermore, to simplify the present explanation, the illustration of FIG. 5 further omits an isolation part generally provided between the memory cell array 2 and the pull-up P-type sense amplifier 4 and between the memory cell array 3 and the pull-down N-type sense amplifier 5. The isolation part is generally driven by a block selection signal to electrically isolate the bit line pair BL, BLB and the data line pair IO, IOB from each other.

Figure 6:
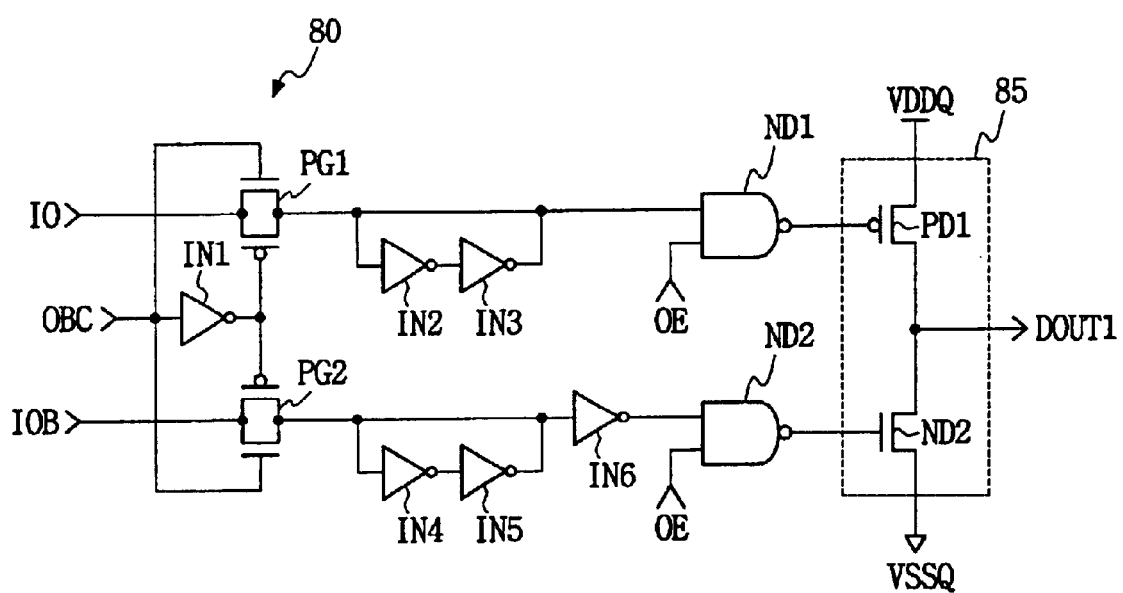
FIG. 6 is an electrical schematic illustrating embodiments of the output buffer circuit of FIG. 3.

Referring now to the electrical schematic illustration of FIG. 6 an output buffer (data output) circuit 80 according to embodiments of the present invention is illustrated. As shown in FIG. 6, pass gates PG1, PG2, NAND gates ND1, ND2 and inverters IN1–IN6 apply the second power supply voltage VDDQ and the second ground voltage VSSQ to a conventional output driver 85. Accordingly, no further explanation of the exemplary circuit of FIG. 6 need be provided herein.

As described above, in accordance with various embodiments of the present invention, cell array internal voltage can be supplied even without a reference voltage generator and a cell array voltage generator. In such embodiments, the power consumed by the device may be reduced and noise occurring in the cell array power supply may be prevented from being transferred to a peripheral circuit power supply or such noise transfers between power supplies maybe minimized. In other embodiments of the present invention the cell array internal voltage is selectively provided from a plurality of power supply voltage sources by selectively using two or more external power supply voltages in response to a control signal to generate the cell array internal voltage. In such embodiments, power consumption and noise occurrence may be reduced and the operational reliability of the integrated circuit device may be improved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of operating an integrated circuit device, comprising the step of:
   selectively driving a power supply terminal of a memory cell array and sense amplifier of the integrated circuit device with a first power supply voltage responsive to a control signal; and
   selectively driving the power supply terminal of the memory cell array and the sense amplifier of the integrated circuit device with a second power supply voltage, delivered to the integrated circuit device separate from the first power supply voltage, responsive to the control signal.

2. The method of claim 1 wherein selectively driving a power supply terminal of a memory cell array and sense amplifier of the integrated circuit device comprises driving a power supply terminal of a differential sense amplifier.

3. The method of claim 2 wherein the first power supply voltage comprises an internal voltage generated by an internal voltage generator circuit of the integrated circuit device that is powered by an external power supply delivered to the integrated circuit device separate from the second power supply voltage.

4. The method of claim 3 further comprising driving a power supply of a data output circuit of the integrated circuit with the second power supply voltage.

5. The method of claim 4 wherein a level of the external power supply voltage is at least equal to a level of the second power supply voltage.

6. The method of claim 5 wherein the level of the external power supply voltage about equals the level of the second power supply voltage.

7. The method of claim 1 wherein the control signal comprises an external control signal.

8. The method of claim 7 wherein the external control signal comprises a mode register set command.

9. An integrated circuit device, comprising:
   a control circuit that selectively drives a power supply terminal of a memory cell array and sense amplifier of the integrated circuit device with a first power supply voltage and selectively drives the power supply terminal of the memory cell array and sense amplifier of the integrated circuit device with a second power supply voltage, delivered to the integrated circuit device separate from the first power supply voltage, responsive to a control signal.

10. The integrated circuit device of claim 9 wherein the integrated circuit device comprises a memory device and the control circuit is configured to drive a power supply terminal of a differential sense amplifier.

11. The integrated circuit device of claim 10 further comprising an internal voltage generator circuit powered by an external power supply voltage delivered to the integrated circuit device separate from the second power supply voltage and wherein the first power supply voltage comprises an internal voltage generated by the internal voltage generator circuit.

12. The integrated circuit device of claim 11 further comprising a data output circuit that is powered by the second power supply voltage.

13. The integrated circuit device of claim 12 wherein a level of the external power supply voltage is at least equal to a level of the second power supply voltage.

14. The integrated circuit device of claim 11 further comprising a switch circuit that couples the second power supply voltage to the power supply terminal.

15. The integrated circuit device of claim 14 wherein the switch circuit comprises a PMOS transistor and wherein the control signal is coupled to a gate of the PMOS transistor.

16. The integrated circuit device of claim 11 wherein the internal voltage generator circuit includes a switch circuit that couples the internal voltage to the power supply terminal.

17. The integrated circuit device of claim 16 wherein the internal voltage generator circuit includes a driver transistor that outputs the internal voltage and wherein the switch circuit includes a PMOS transistor that couples the first power supply voltage to a gate of the driver transistor.

18. An integrated circuit memory device, comprising:
   a sense amplifier having first and second inputs electrically coupled to a pair of differential signal lines;
   a memory cell array coupled to the sense amplifier;
   a voltage generator circuit having an internal voltage output selectively coupled to one of the pair of differential signal lines, the voltage generator circuit being powered by a first power supply voltage;
   a second power supply voltage selectively coupled to the one of the pair of differential signal lines, the second power supply voltage being delivered to the integrated circuit memory device separate from the external power supply voltage; and
   a control circuit that selects the internal voltage output and/or the second power supply voltage responsive to a control signal.

19. The integrated circuit memory device of claim 18 further comprising a data output circuit powered by the second power supply voltage.

20. The integrated circuit memory device of claim 18 wherein the control signal comprises a mode register set command.

21. A method of supplying power supply voltage in a semiconductor memory device, comprising:

applying a first power supply voltage to the semiconductor memory device;

applying a second power supply voltage, applied from external to the semiconductor memory device separately from the first power supply voltage, to a data output circuit; and directly supplying the second power supply voltage to a memory cell array and sense amplifier circuit as a cell array internal voltage for operation of the memory cell array and sense amplifier.

22. The method of claim 21 wherein the second power supply voltage is directly supplied to the memory cell array and sense amplifier circuit through a switch.

23. The method of claim 21, wherein a level of said first power supply voltage is at least equal to a level of the second power supply voltage.

24. The method of claim 21, wherein said cell array internal voltage is applied to a bit line connected to a memory cell through a sense amplifier.

25. A circuit for supplying cell array power supply voltage in a semiconductor memory device, said circuit comprising:

a power supply line providing a first power supply voltage from external to the semiconductor memory device; and a power supply providing line, said power supply providing line configured to directly supply a second power supply voltage, applied from external to the semiconductor memory device separately from the first power supply voltage, to a memory cell array and sense amplifier circuit as a cell array internal voltage for operation of the memory cell array and sense amplifier, wherein said first power supply voltage is for use in a core and a peripheral circuit of the semiconductor memory device and said second power supply voltage is for use in a data output circuit of the semiconductor memory device.

26. The circuit of claim 25, wherein a level of said first power supply voltage is at least equal to a level of the second power supply voltage.

27. A method of supplying power supply voltage in a semiconductor memory device, comprising:

applying a first power supply voltage applied from external to the semiconductor memory device;

applying a second power supply voltage applied from external to the semiconductor memory device separately from the first power supply voltage, to a data output circuit; and selectively applying a cell array internal voltage for operation of a memory cell array and sense amplifier circuit through a cell array internal voltage down converter or a second power supply voltage supplying part, said cell array internal voltage down converter being operated by the first power supply voltage and said second power supply voltage supplying part being configured to directly supply the second power supply voltage.

28. The method of claim 27 wherein the power supply voltage supplying part directly supplies the second power supply voltage through a switch.

29. The method of claim 27, wherein said cell array internal voltage down converter and said second power supply voltage supplying part are activated by an external control signal.

30. A circuit for supplying cell array power supply voltage in a semiconductor memory device, said circuit comprising:

a cell array internal voltage down converter for receiving a first power supply voltage for use in a core and a peripheral circuit of the semiconductor memory device, generating a cell array internal voltage for operation of a memory cell array and sense amplifier of the semiconductor memory device, and outputting the cell array internal voltage to a cell array internal voltage supplying line; and a second power supply voltage supplying part activated in response to an operation control signal, said second power supply voltage supplying part being connected to the cell array internal voltage supplying line so as to directly supply, as the cell array internal voltage, a second power supply voltage, wherein said second power supply voltage is applied from external to the semiconductor memory device separately from the first power supply voltage.

31. The circuit of claim 30, wherein a level of said first power supply voltage is at least equal to a level of the second power supply voltage.

32. The circuit of claim 30, wherein a level of said second power supply voltage is the same as a level of the cell array internal voltage.

33. The circuit of claim 30, wherein said cell array internal voltage down converter and said second power supply voltage supplying part are selectively activated by an external control signal.

34. The circuit of claim 33, wherein said external control signal is a mode register set command.

* * * * *